United States Patent
Mallon

[19]

[11] Patent Number: 6,163,634
[45] Date of Patent: Dec. 19, 2000

[54] OPTICAL SWITCH

[75] Inventor: Charles A. Mallon, Chesterfield, Mich.

[73] Assignee: TRW Inc., Lyndhurst, Ohio

[21] Appl. No.: 09/339,495

[22] Filed: Jun. 24, 1999

[51] Int. Cl.⁷ .................................................. G02B 6/26
[52] U.S. Cl. ................................ 385/17; 385/16; 385/19
[58] Field of Search .................................. 385/16, 17, 19

[56] References Cited

U.S. PATENT DOCUMENTS

| | | |
|---|---|---|
| 3,360,657 | 12/1967 | Shlesinger, Jr. . |
| 4,818,052 | 4/1989 | Le Pesant et al. . |
| 4,934,775 | 6/1990 | Koai . |
| 5,044,745 | 9/1991 | Inoue et al. . |
| 5,080,504 | 1/1992 | Partain et al. . |
| 5,664,032 | 9/1997 | Bischel et al. . |
| 5,699,462 | 12/1997 | Fouquet et al. . |
| 5,796,884 | 8/1998 | Wingo . |

*Primary Examiner*—James Phan
*Attorney, Agent, or Firm*—Tarolli, Sundheim, Covell, Tummino & Szabo L.L.P.

[57] ABSTRACT

An optical switch (10) comprises a body of resilient material (12) including resilient opaque material (16) and resilient light conducting material (14). The light conducting material (14) is arranged in rows (20) and columns (22) which intersect at junctures (30). At least one light transmitter (50) directs light into one end of the rows (20) and columns (22) and through the junctures (30). Each juncture (30) is deformable to modify the intensity of light transmitted through the juncture (30). At least one light receiver (52) receives the light transmitted through the juncture (30) and provides an output signal in response to the modified light intensity.

8 Claims, 2 Drawing Sheets

OPTICAL SWITCH

FIELD OF THE INVENTION

The present invention relates to an optical switch.

BACKGROUND OF THE INVENTION

Known devices transmit and receive optical signals via light transmitting media. The known devices include a transmitter that transmits an optical signal through light transmitting media, typically fiberoptic cables, to a receiver that detects the optical signal and provides an output signal in response to the optical signal.

SUMMARY OF THE INVENTION

In accordance with the present invention, an optical switch comprises a body of resilient material including resilient opaque material and resilient light conducting material. The light conducting material is arranged in rows and columns which intersect at junctures. At least one light transmitter directs light into one end of the rows and columns and through the junctures. Each juncture is deformable to modify the intensity of light transmitted through the juncture. At least one light receiver receives the light transmitted through the juncture and provides an output signal in response to the modified light intensity.

BRIEF DESCRIPTION OF THE DRAWINGS

The foregoing and other features of the present invention will become apparent to one skilled in the art to which the present invention relates upon reading the following description of the invention with reference to the accompanying drawings, wherein.

DESCRIPTION OF PREFERRED EMBODIMENTS

Figure 1:
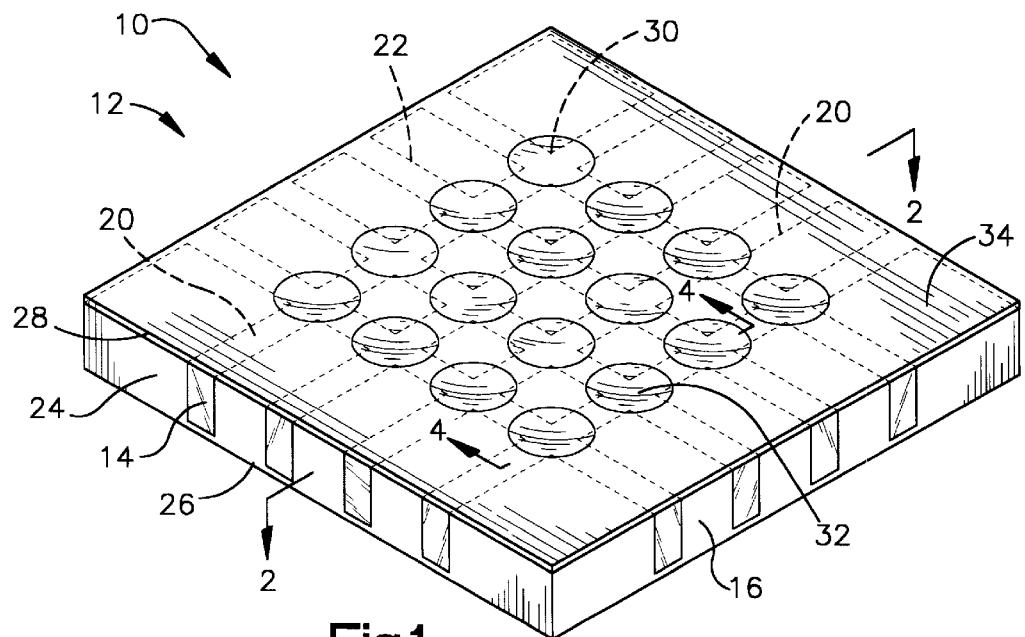
FIG. 1 is a schematic isometric view of an optical switch, according to the present invention.

Referring to FIG. 1, an optical switch 10 comprises a body 12 of resilient material that includes resilient light conducting material 14 and resilient opaque material 16. The light conducting material 14 is arranged in rows 20 and columns 22 that are disposed in the resilient opaque material 16. The resilient opaque material 16 forms a grid 24 that is disposed between a base layer 26 and a top layer 28. The rows 20 and columns 22 of light conducting material 14 are arranged in the grid 24 such that opaque material 16 is disposed between the rows 20 and columns 22.

Figure 2:
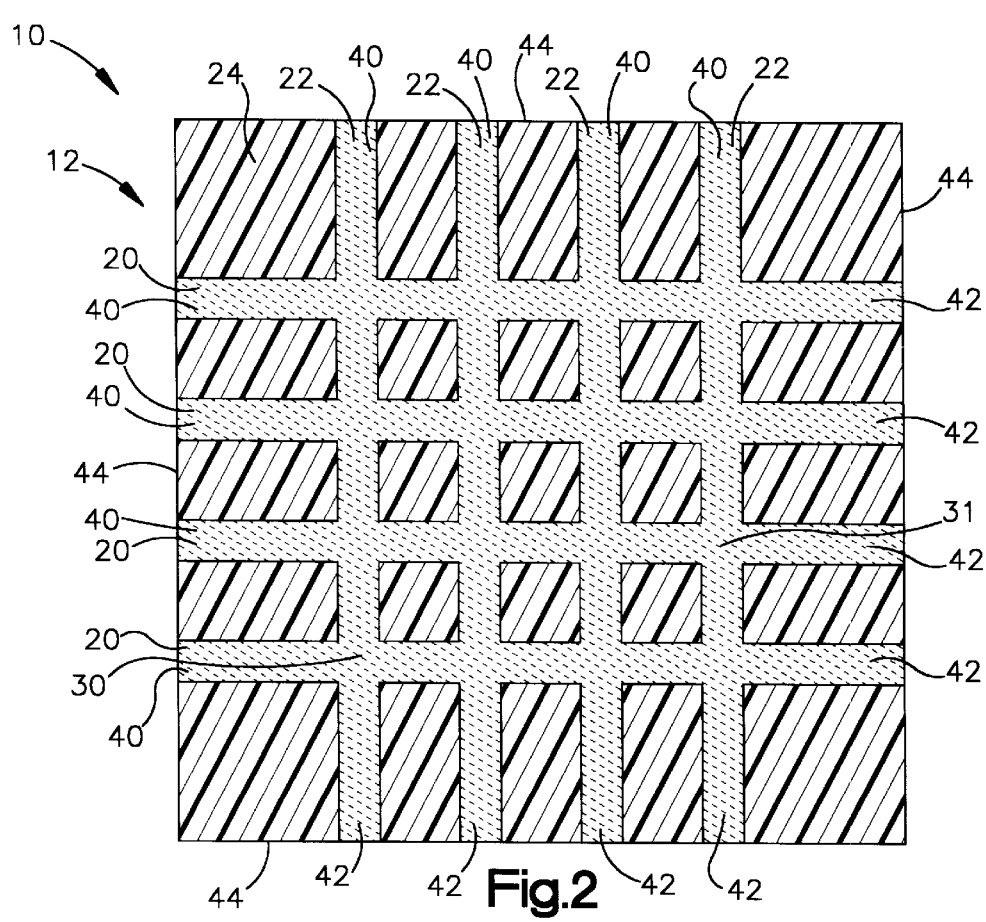
FIG. 2 is a sectional view of the optical switch taken along line 2—2 in FIG. 1.

Referring to FIG. 2, the rows 20 and columns 22 intersect at junctures 30. In the illustrated embodiment, the grid 24 includes four rows 20 and four columns 22. It should be realized, however, that the grid 24 can include any number of rows 20 and columns 22 as long as at least one juncture 30 is formed. Also, in the illustrated embodiment, the rows 20 and columns 22 are of a linear configuration and intersect at right angles. The rows 20 and columns 22, however, may be of a non-linear configuration and may intersect at any angle. While the body 12 of resilient material is arranged in an rectangular configuration, it will be appreciated by those skilled in the art that the body 12 of resilient material can be configured in a variety of shapes without negatively effecting the functionality of the invention.

The opaque material 16 consists of a resilient material, such as rubber, that is molded or otherwise formed so as to produce the base layer 26 (FIG. 1) and the grid 24. In the illustrated embodiment, the grid 24 is molded as one piece with the base layer 26 and forms intersecting channels 31 (FIG. 2). The light conducting material 14 consists of a light conducting gel that is poured into the channels 31. The light conducting gel conforms to the dimensions of the channels 31 and is cured to form the intersecting rows 20 and columns 22. The top layer 28 (FIG. 1) is disposed over the grid 24, opposite the base layer 26, and is bonded thereto by known means such as an adhesive. It will be recognized by those skilled in the art, however, that alternative materials and constructions may also be suitable.

The top layer 28 may include a series of target areas 32 located on a surface 34 of the top layer 28 opposite the grid 24. In the illustrated embodiment, the target areas 32 consist of recesses in the top layer 28. The target areas 32 are arranged such that a target area 32 overlies each juncture 30.

As illustrated in FIG. 2, each row 20 and column 22 includes a transmitting end 40 and an opposite receiving end 42. In the illustrated embodiment, the transmitting ends 40 and receiving ends 42 of the rows 20 and columns 22 are arranged along respective edges 44 of the rectangular body 12 of resilient material. It should be realized, however, that alternative arrangements, such as alternating transmitting ends 40 and receiving ends 42 along an edge 14 of the body 12 of resilient material would be equally suitable.

Figure 3:
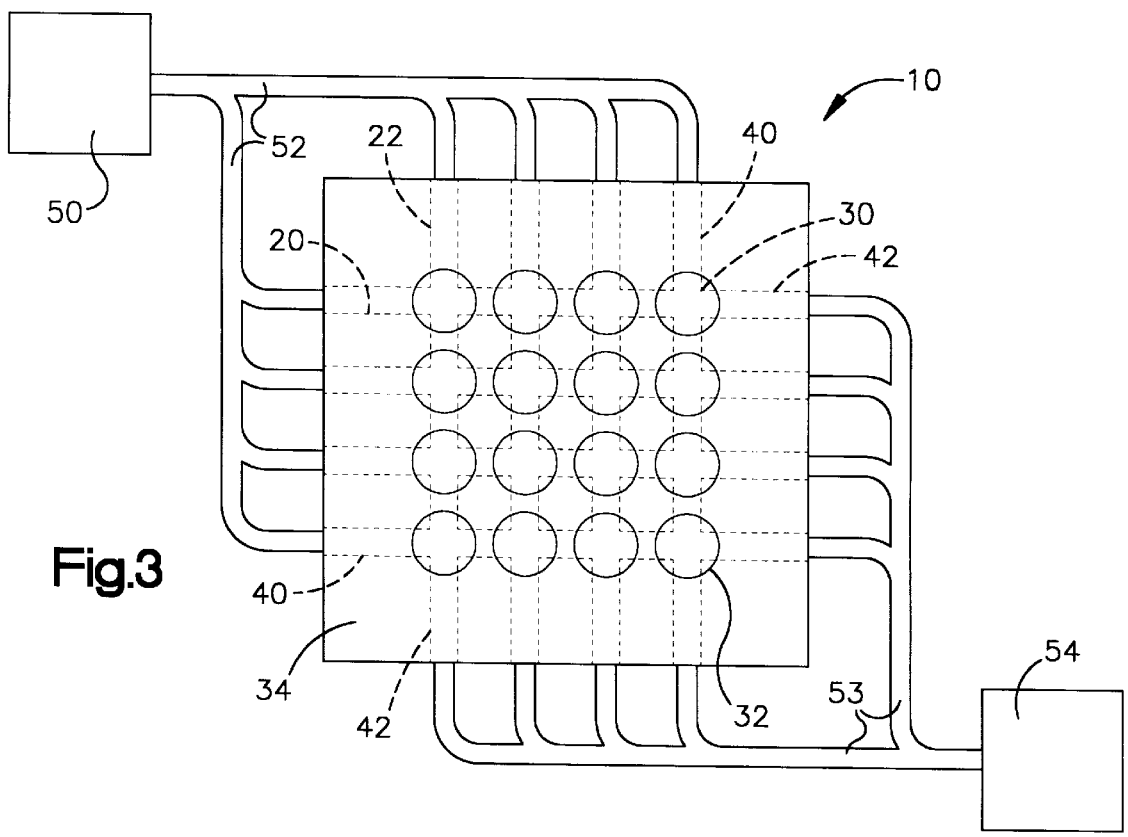
FIG. 3 is a schematic illustration of the optical switch of FIG. 1 depicting a use of the switch.

As illustrated in FIG. 3, the transmitting end 40 of each row 20 and column 22 is connected to a light transmitter 50 (shown schematically in FIG. 3) by a light transmitting connector 52, such as fiberoptic cabling. The light transmitter 50 includes means for generating a light signal (not shown), such as a light emitting diode. The receiving end 42 of each row 20 and column 22 is connected to a light receiver 54 (shown schematically in FIG. 3) by a light transmitting connector 53. The light receiver 54 includes means for receiving a light signal (not shown), such as a light emitting diode or a photoreceptor, and means for generating an output signal based upon the intensity of the received light signal.

Although the illustrated embodiment depicts a single light transmitter 50 and a single light receiver 54, it should be realized that a number of light transmitters 50 and/or receivers 54 can be connected to the rows 20 and columns 22. For example, a single light transmitter 50 could used to transmit light through all of the rows 20 and columns 22 while individual light receivers 54 could be connected to the receiving end 42 of each row 20 and column 22 in order to receive the transmitted light signals.

The light transmitter 50 transmits a light signal from the transmitting end 40 to the receiving end 42 of each row 20 and column 22. The light receiver 54 detects the transmitted light signal and generates an output based on the intensity of the light signal.

Each juncture 30 (FIG. 1) is capable of being deformed by applying a compressive force to the juncture 30 in a direction transverse to the surface 34. In the illustrated embodiment, a compressive force may be applied to a juncture 30 by pressing the associated target area 32 overlying the juncture 30.

Figure 4:
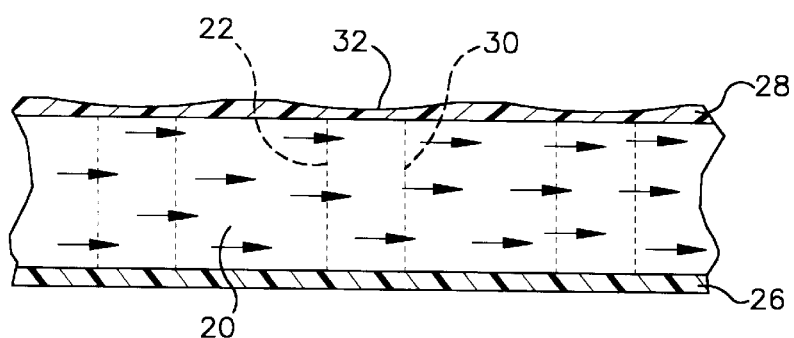
FIG. 4 is an enlarged sectional view of a portion of the optical switch, taken along line 4—4 in FIG. 1, depicting first condition of the switch.
Figure 5:
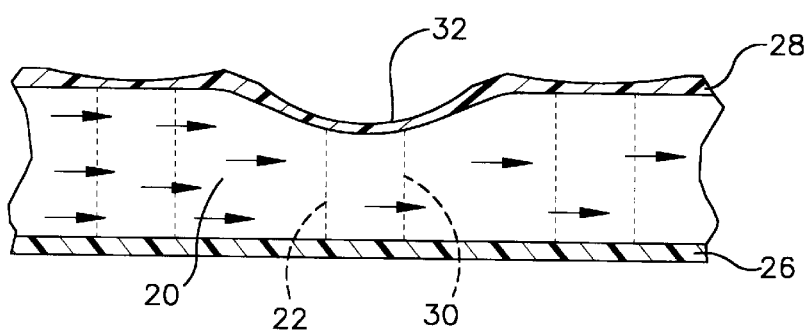
FIG. 5 is an enlarged sectional view of a portion of the optical switch, taken along line 4—4 in FIG. 1, depicting a second condition of the switch.

As illustrated in FIGS. 4 and 5, a light signal passing through a juncture 30 is indicated generally by arrows. Referring to FIG. 4, the juncture 30 is in an unactuated, non-deformed condition and has an optical transmittance associated with the unactuated condition. The juncture 30 thus permits the light signal to pass with little or no reduction in intensity. The light signal has a uniform intensity which is indicated generally by the density of the arrows in FIG. 4.

Referring to FIG. 5, the juncture 30 is illustrated in an actuated condition wherein a compressive force is applied to the juncture 30 via the target area 32. The force is effective to compress and deform the juncture 30. In the actuated condition, the cross-sectional area of the intersecting row 20 and column 22 is reduced. As a result, the junction 30 has an optical transmittance that is lower than the transmittance in the unactuated condition of FIG. 4. The intensity of the light signal in FIG. 5 is modified to a reduced level as the signal is transmitted through the juncture 30. The intensity of the light signal is indicated generally by the density of the arrows in FIG. 5.

Thus, the juncture 30 is actuatable from a first condition (FIG. 4) wherein the intersecting row 20 and column 22 have a first optical transmittance to a second condition (FIG. 5) wherein the intersecting row and column have a second optical transmittance different from the first optical transmittance.

As best illustrated in FIG. 3, the actuation of any one juncture 30 in the switch 10 from the first condition to the second condition involves the compression and deformation of a unique combination of a row 20 and a column 22. Accordingly, the actuation of any one juncture 30 is indicated by the reduced intensity of the light signal transmitted through the intersecting row 20 and column 22 which form the juncture 30. The light receiver 54 senses the reduced intensity of the light signals transmitted through the intersecting row 20 and column 22 and may provide an output signal indicative of the actuated juncture 30. Thus, the optical switch 10 may be used for a variety of purposes, such as for a keypad, where an array of individually operable and discernable switches is required.

From the above description of the invention, those skilled in the art will perceive improvements, changes and modifications. Such improvements, changes and modifications within the skill of the art are intended to be covered by the appended claims.

Having described the invention, the following is claimed:

1. An optical switch comprising:

a body of resilient material including resilient opaque material and resilient light conducting material, said light conducting material being arranged in rows and columns which intersect at junctures;

at least one light transmitter for directing light into one end of said rows and columns and through said junctures;

each of said junctures being deformable to modify the intensity of light transmitted through the juncture; and at least one light receiver for receiving light transmitted through the juncture and providing an output signal in response to the modified light intensity.

2. The optical switch as defined in claim 1 wherein said body of material further comprises:

a base layer of said resilient opaque material; and a top layer of said resilient opaque material disposed in an overlying relationship with said base layer;

said rows and columns being disposed between said base layer and said top layer;

said resilient opaque material being disposed between said rows and columns.

3. The optical switch as defined in claim 1 wherein each said juncture is actuatable from a first condition wherein said intersecting row and column have a first optical transmittance to a second condition wherein said juncture is deformed and said intersecting row and column have a second optical transmittance, different than said first optical transmittance.

4. The optical switch as defined in claim 3 wherein any one of said junctures is actuated from said first condition to said second condition by compressing said one juncture in a direction transverse the row and column that intersect at said one juncture.

5. The optical switch as defined in claim 3 wherein each said row and each said column includes a transmitting end opposite a receiving end, said transmitting end being connected to said at least one light transmitter and said receiving end being connected to said at least one light receiver.

6. The optical switch as defined in claim 5 wherein said light receiver detects the modified light intensity transmitted through any one of said junctures at the receiving end of the row and column that intersect at said one juncture when said one juncture is actuated from said first condition to said second condition.

7. The optical switch as defined in claim 6 wherein the actuation of any one of said junctures is sensed by said light receiver.

8. The optical switch as defined in claim 1 wherein said resilient light conducting material comprises a light conducting gel.

* * * * *